(12) United States Patent
Yoshioka et al.

(10) Patent No.: US 6,500,317 B1
(45) Date of Patent: Dec. 31, 2002

(54) PLATING APPARATUS FOR DETECTING THE CONDUCTIVITY BETWEEN PLATING CONTACTS ON A SUBSTRATE

(75) Inventors: Junichiro Yoshioka; Satoshi Sendai; Atsushi Chono; Mitsuo Tada; Akihisa Hongo; Yoshitaka Mukaiyama; Kenya Tomioka; Akira Ogata; Kenichi Suzuki, all of Tokyo; Naomitsu Ozawa, Kanagawa, all of (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/581,761

(22) PCT Filed: Dec. 16, 1998

(86) PCT No.: PCT/JP98/05672

§ 371 (c)(1),
(2), (4) Date: Jun. 16, 2000

(87) PCT Pub. No.: WO99/31304

PCT Pub. Date: Jun. 24, 1999

(30) Foreign Application Priority Data

Dec. 16, 1997 (JP) .............................. 9-363944
Jul. 10, 1998 (JP) ............................ 10-195932

(51) Int. Cl.[7] .............................. C25B 9/04; C25D 21/12
(52) U.S. Cl. ................................ 204/228.7; 204/229.8; 204/230.8

(58) Field of Search .................... 204/229.8, 230.8, 204/228.1, 224 R, 297.05, 297.14, 228.7; 205/133

(56) References Cited

U.S. PATENT DOCUMENTS

| | | | |
|---|---|---|---|
| 6,004,440 A | * | 12/1999 | Hanson et al. |
| 6,071,388 A | * | 6/2000 | Uzoh ..................... 204/297 R |
| 6,071,399 A | * | 6/2000 | Van der Bergen et al. .. 205/337 |
| 6,139,712 A | | 10/2000 | Patton et al. |
| 6,156,167 A | | 12/2000 | Patton et al. |

FOREIGN PATENT DOCUMENTS

| | | |
|---|---|---|
| JP | 50-8733 | 1/1975 |
| JP | 56-93900 | 7/1981 |
| JP | 63-241472 | 10/1988 |
| JP | 5-320977 | 12/1993 |
| JP | 3003657 | 8/1994 |

* cited by examiner

Primary Examiner—Nam Nguyen
Assistant Examiner—Wesley A. Nicolas
(74) Attorney, Agent, or Firm—Wenderoth, Lind & Ponack, L.L.P.

(57) ABSTRACT

The present invention provides a conductivity sensing device capable of detecting the conductivity (contact state) of the plurality of feeder contacts contacting the conductive area of the substrate, and a plating apparatus capable of forming a plating film of uniform thickness by supplying a uniform plating current through a plurality of feeder contacts.

5 Claims, 12 Drawing Sheets

PRIOR ART

F I G. 7
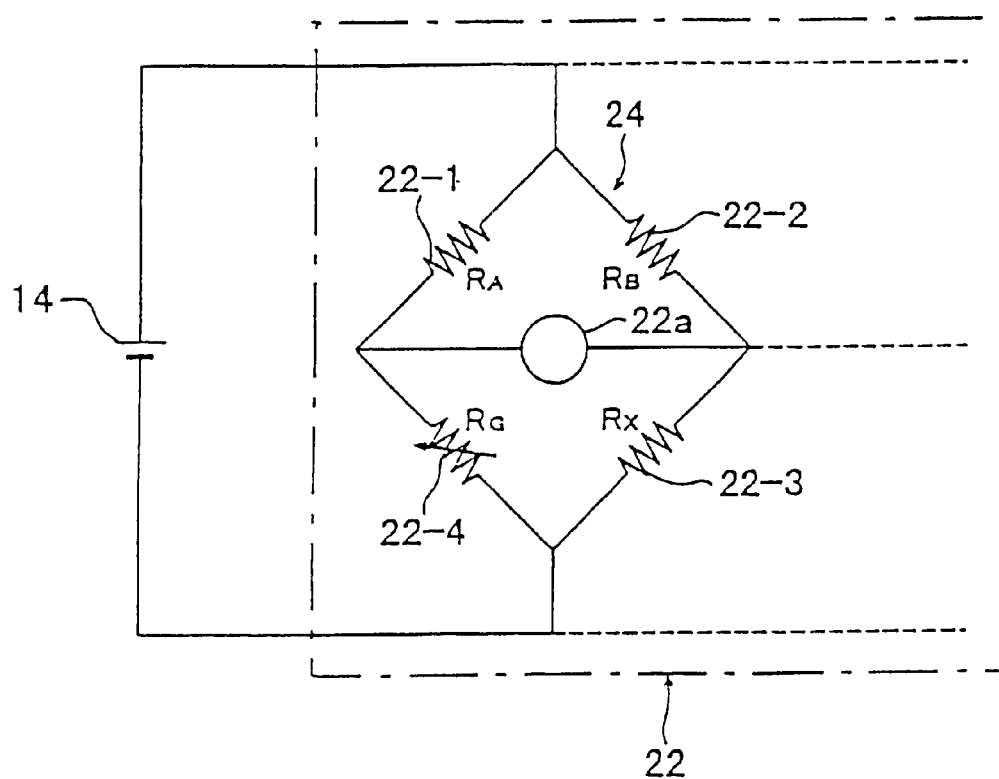

F I G. 8
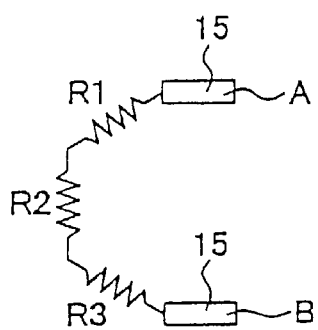
F I G. 9
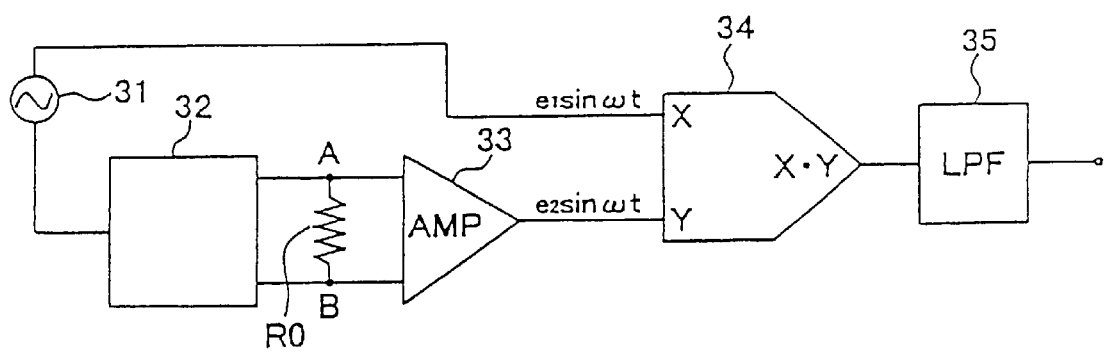

PLATING APPARATUS FOR DETECTING THE CONDUCTIVITY BETWEEN PLATING CONTACTS ON A SUBSTRATE

TECHNICAL FIELD

The present invention relates to a plating apparatus for plating a substrate such as a semiconductor wafer or the like, and particularly to a plating apparatus capable of forming a plating film of uniform thickness by uniformly conducting a current on the substrate.

BACKGROUND ART

FIG. 1 shows the general construction of this type of conventional plating apparatus. As shown in the drawing, the plating apparatus includes a plating bath 10 accommodating a plating solution Q, in which a substrate 12 such as a semiconductor wafer or the like mounted on a jig 11 and an anode 13 are disposed oppositely. A power source 14 applies a predetermined DC voltage between the jig 11 and anode 13 thereby forming a plating film on the substrate 12 by supplying an electric current via the plating solution Q.

A feeder section 16 is provided on the jig 11. The feeder section 16 includes a plurality of feeder contacts 15 contacting the conductive area on the surface of the substrate 12. The power source 14 is electrically connected to the feeder contacts 15 thereby a plating current flows through the anode 13, substrate 12, and feeder contacts 15.

Therefore, if the feeder contacts 15 do not reliably contact the conductive film on the substrate 12, either the plating process cannot be performed or the plating film formed on the substrate 12 will not be uniform. The conventional apparatus does not have a method or device for facilitating confirmation of the contact state between the feeder contacts 15 and the conductive film on the substrate 12.

DISCLOSURE OF INVENTION

In view of the foregoing, it is an object of the present invention to provide a plating apparatus capable of forming a plating film of uniform thickness by supplying a uniform plating current through a plurality of feeder contacts contacting the conductive area of the substrate. It is another object of the present invention to provide a conductivity sensing device for detecting the conductivity (contact state) of the plurality of feeder contacts.

To solve the above mentioned subject matter, there is provided a method for confirming conductivity state between a plating jig having a plurality of conducting pins and a substrate to be plated having a conductive film, the substrate being mounted on the plating jig having a plurality of conducting pins such that the conducting pins contact the conductive film thereon, the method comprising: disposing the conducting pins of the plating jig being electrically separated independently with each other; attaching an end of reverse-current blocking diode to wiring connecting to the conducting pins, and connecting to the other ends of the reverse-current blocking diodes together to wiring connecting to a plating power source; and measuring an electrical resistance between the wiring so as to measure the electrical resistance between conducting pins of the plating jig.

According to another aspect of the present invention, the conductivity state detector may comprise a contact resistance measuring device for measuring contact resistance between the feeder contacts and the conductive area on the surface of the substrate and detects the conductivity state of the feeder contacts based on the contact resistance measured by the contact resistance measuring device.

According to another aspect of the present invention, the conductivity state detector may comprise a current sensor for detecting current flowing through each of the plurality of feeder contacts and detects the conductivity state of the feeder contacts based on the current detected by the current sensor.

According to another aspect of the present invention, the plating apparatus may comprise a plating current detector for detecting a plating current flowing through the feeder contacts; and a plating current controller for maintaining a uniform plating current flowing through the feeder contacts based on output from the plating current detector.

BRIEF DESCRIPTION OF DRAWINGS

FIG. 7 shows an example circuit construction of the conductivity sensing device in FIG. 6;

FIG. 8 shows the structure of an equivalent circuit for resistances between feeder contacts;

FIG. 9 shows an example of a basic circuit construction for measuring resistance values between feeder contacts;

BEST MODE FOR CARRYING OUT THE INVENTION

Figure 2:
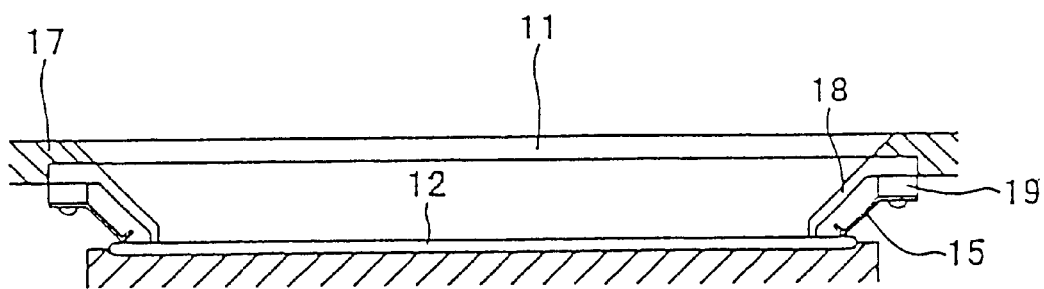
FIG. 2 is a cross-sectional view showing an example construction of the feeder section for a plating apparatus according to the present invention.

FIG. 2 is a cross-sectional view showing an example construction for a feeder section of a jig 11 according to a preferred embodiment of the present invention. As shown in the drawing, the feeder section includes an annular frame 17, an annular packing 18 disposed along the inner side of the frame 17, a feeder ring 19 disposed along the inner side of the packing 18, and a plurality of feeder contacts 15 arranged at predetermined intervals on the feeder ring 19. The ends of the feeder contacts 15 contact and are electrically connected to a conductive area (not shown) formed on the outer surface of a substrate 12. The ends of the packing 18 are configured to closely contact and apply pressure to the surface of the substrate 12 in order to prevent plating solution from entering inside the packing 18. Hence, the feeder contacts 15, feeder ring 19, and the like are not exposed to the plating solution.

Figure 3:
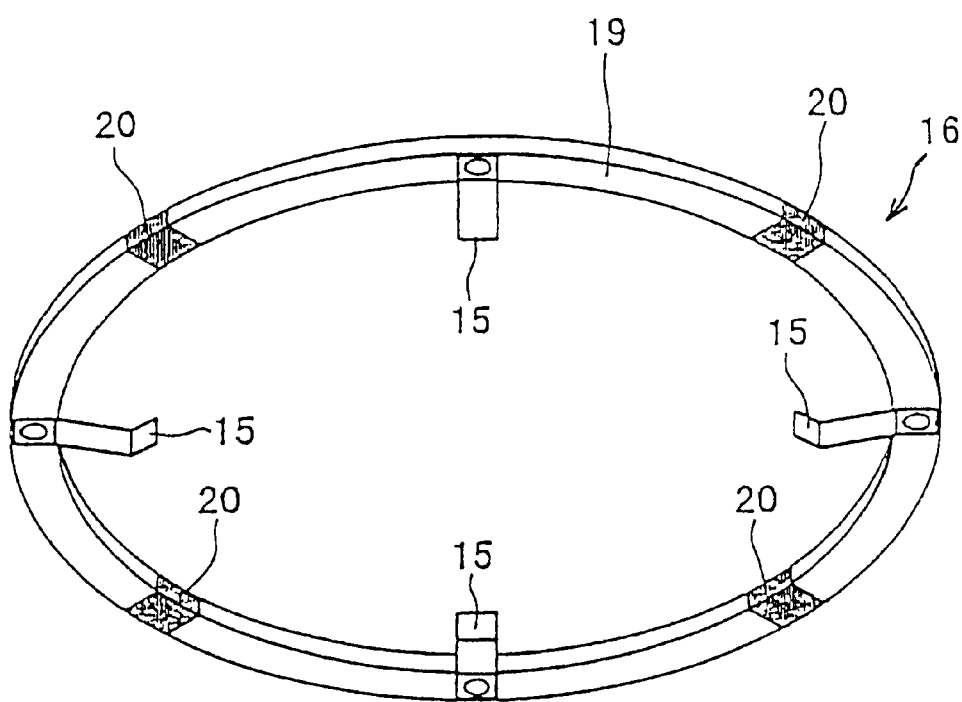
FIG. 3 is a perspective view as viewed from the bottom showing the positioning of feeder contacts mounted on the feeder ring of the feeder section and separated by insulating members.

FIG. 3 is a perspective view showing the state of the feeder contacts 15 mounted on the feeder ring 19. As shown in the drawing, the feeder contacts 15 are mounted at predetermined intervals along the feeder ring 19. A plurality of insulating members 20 (four in this example) electrically divide the feeder ring 19 into sections, such that one feeder contact 15 is mounted on each section of the feeder ring 19. The drawing shows a perspective view of the feeder ring 19 and the feeder contacts 15 attached thereto as viewed from the bottom.

Figure 4:
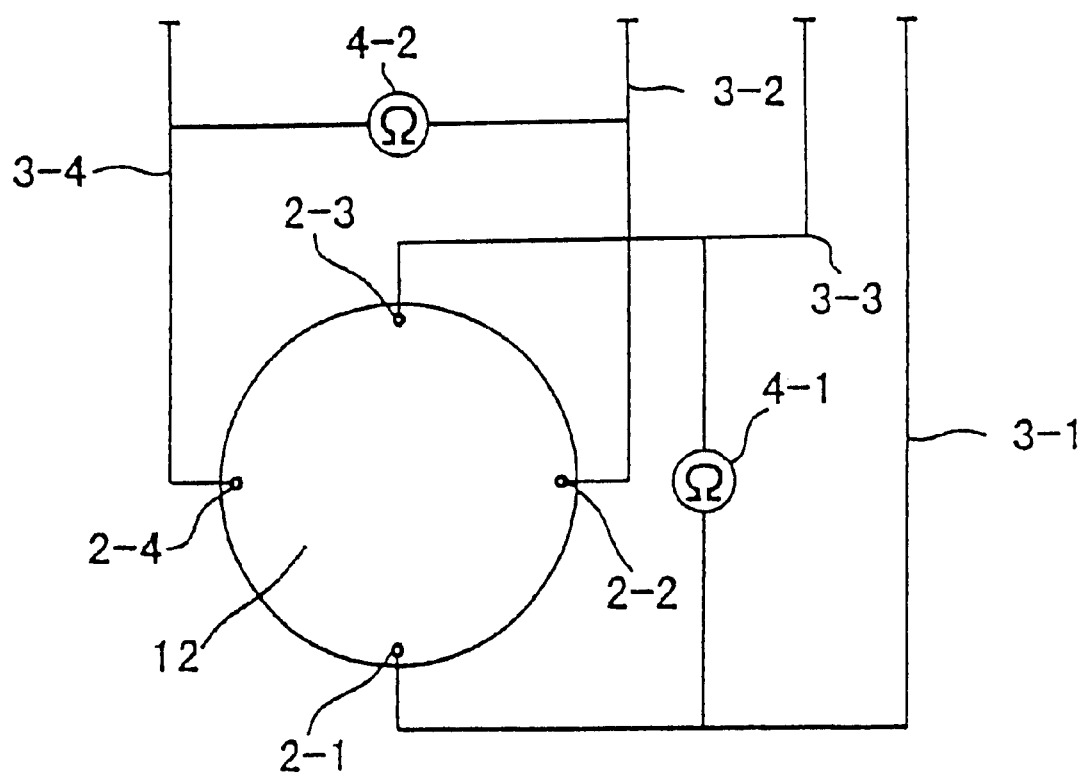
FIG. 4 shows an example circuit construction for implementing a method to confirm conductivity between the jig and wafer according to a first embodiment of the present invention.

FIG. 4 shows an example circuit configuration for implementing the method of confirming conductivity between the semiconductor wafer (substrate to be plated) and jig according to the first embodiment of the present invention. As shown in the drawing, conducting pins 2-1, 2-2, 2-3, and 2-4 contact the conductive film of the substrate 12 mounted on the jig (not shown). The conducting pins serve as the feeder contacts of the jig and are disposed at intervals of 90 degrees around the substrate 12. Each of the conducting pins is mounted on the jig as shown in FIG. 3. One ends of wires 3-1, 3-2, 3-3, and 3-4, are connected to the conducting pins 2-1, 2-2, 2-3, and 2-4, respectively. The other ends of the wires are connected to the negative electrode of the power source 5.

A resistance measuring device 4-1 is connected between the wires 3-1 and 3-3. A resistance measuring device 4-2 is connected between the wires 3-2 and 3-4. A jig having the circuit configuration described above is disposed opposite the anode 13 in the plating solution Q contained in the plating bath 10 shown in FIG. 1. The jig conducts electric current supplied from the DC power source (plating power source) 14. When each of the conducting pins 2-1, 2-2, 2-3, and 2-4 forms a reliable electrical contact with the conductive film on the substrate 12, then the resistance between the pins is 0 or an extremely small value, and the potential difference between the conducting pins will be 0 or an extremely small value. However, when one of the conducting pins is not in contact with or is in insufficient contact with the substrate 12, then this will create a large contact resistance that generates a great potential difference between this conductive pin and the others. The electrical resistance caused by this potential difference is measured by the resistance measuring device 4-1 and 4-2.

Hence, when the resistance value measured by the resistance measuring device 4-1 is greater than a predetermined value, either the conducting pin 2-1 or 2-3 or both are not contacting or are forming a poor contact with the substrate 12. When the resistance value measured by the resistance measuring device 4-2 is greater than a predetermined value, either the conducting pin 2-2 or 2-4 or both are not contacting or are forming a poor contact with the substrate 12.

Figure 5:
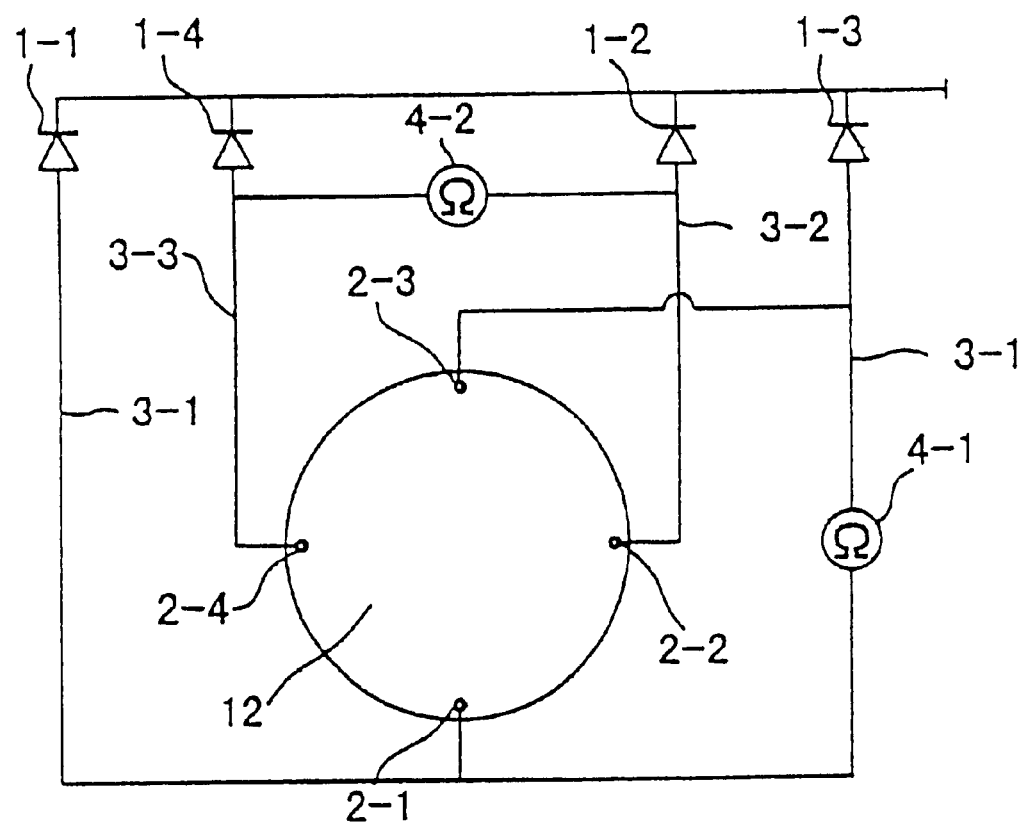
FIG. 5 shows a variation of the circuit construction in FIG. 4.

FIG. 5 shows an example circuit configuration for implementing the method for confirming conductivity between a semiconductor wafer and jig according to the present invention. The circuit in FIG. 5 differs from that of FIG. 4 as follows. The anode of reverse-current blocking diodes 1-3 is connected to the connection point of the wire 3-1 and resistance measuring device 4-1. The anode of reverse-current blocking diodes 1-2 is connected to the connection point of the wire 3-2 and resistance measuring device 4-2. The anode of reverse-current blocking diodes 1-4 is connected to the connection point of the wire 3-3 and resistance measuring device 4-2. The anode of reverse-current blocking diodes 1-1 is connected to the connection point of the wire 3-1 and resistance measuring device 4-1. The cathodes of the reverse-current blocking diodes are connected as one to the negative electrode of the power source 14.

Figure 1:
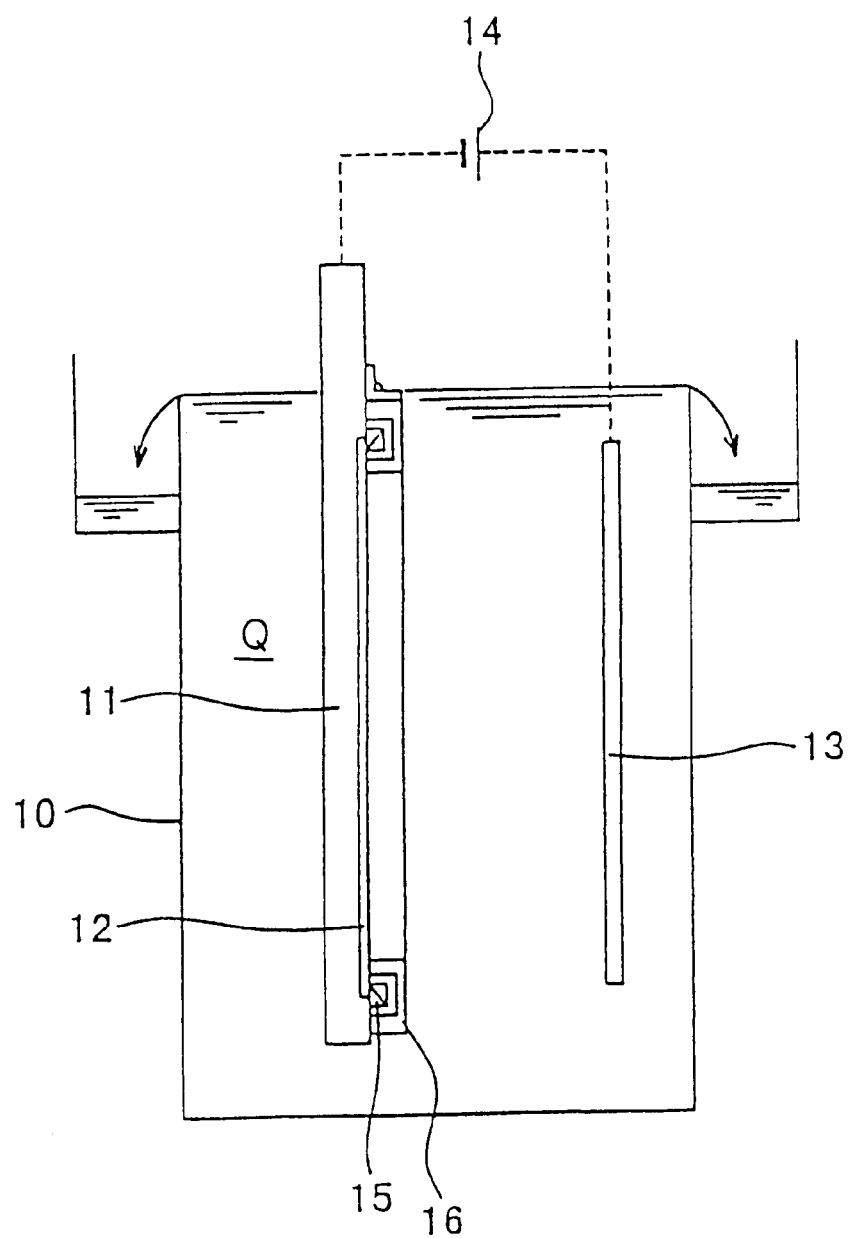
FIG. 1 shows the general construction of a plating apparatus according to the conventional technology.

With this construction, that is to provide reverse-current blocking diodes 1-1 through 1-4, it is possible to prevent current from circulating between conducting pins and to measure electrical resistance between the same when there is only one conductive area between the jig and power source 14 of FIG. 1. Hence, when the resistance value measured by the resistance measuring device 4-1 is greater than a predetermined value, either the conducting pin 2-1 or 2-3 or both are not contacting or are forming a poor contact with the substrate 12. When the resistance value measured by the resistance measuring device 4-2 is greater than a predetermined value, either the conducting pin 2-2 or 2-4 or both are not contacting or are forming a poor contact with the substrate 12.

Figure 6:
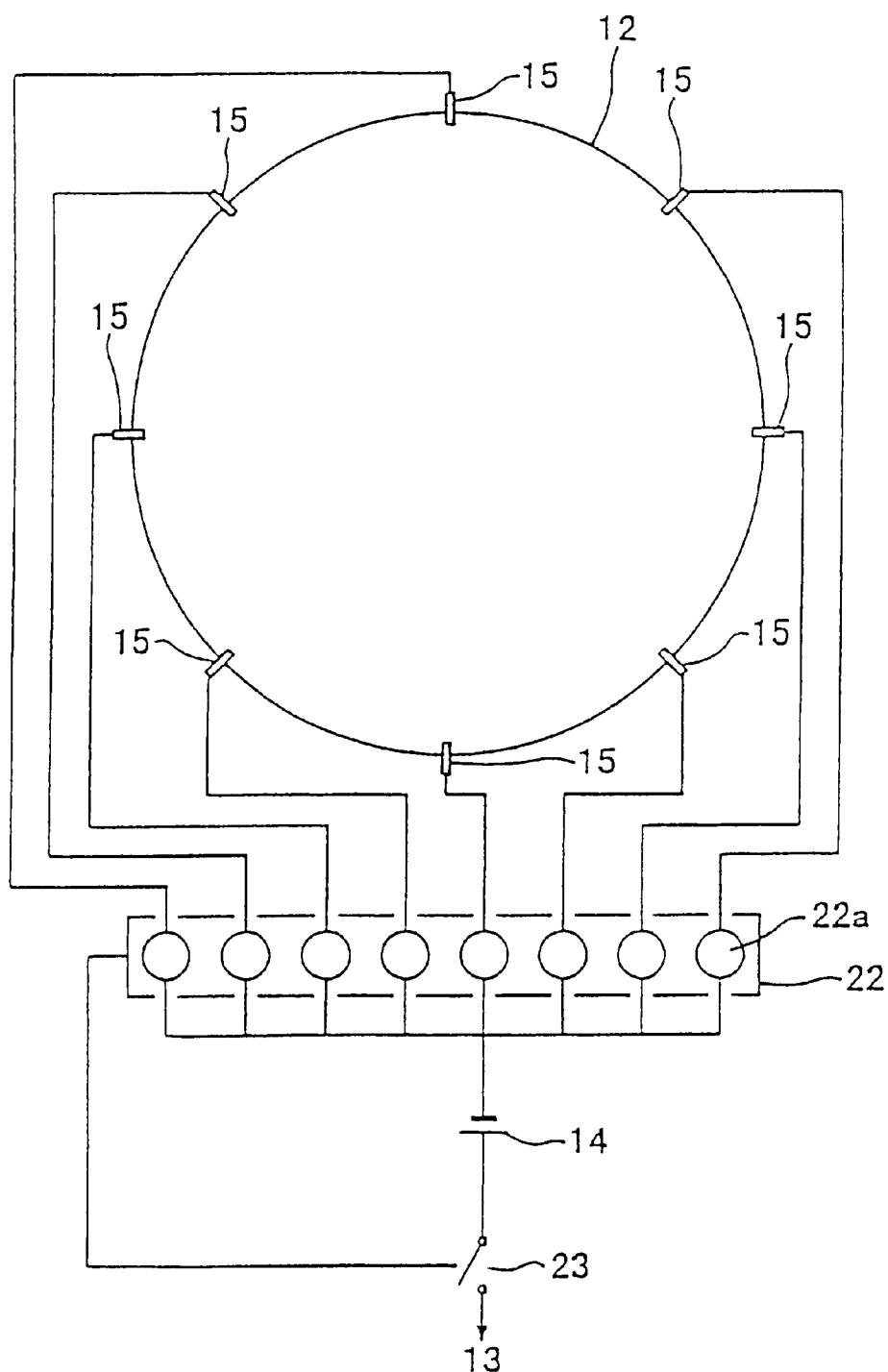
FIG. 6 shows the general construction of a conductivity sensing device for a plating apparatus according to the second embodiment.

FIG. 6 shows the general structure of a conductivity state sensor for the plating apparatus according to a second embodiment of the present invention. A plurality of feeder contacts 15 contacts the conductive area of the substrate 12, which is a semiconductor wafer or the like. Each of the feeder contacts 15 connects to a conductivity sensor 22. The structure of the plating apparatus according to the present invention is approximately the same as that shown in FIG. 1, except the power source 14 is connected between the anode 13 and the conductivity sensor 22.

During the operation for plating the substrate 12, the conductivity sensor 22 detects the conductivity state of each of the feeder contacts 15. When poor conductivity (poor connection between one of the feeder contacts 15 and the conductive area on the substrate 12) is detected by the conductivity sensor 22, thereby the conductivity sensor 22 opens a switch 23 to turn off the power source 14 or issues a warning.

FIG. 7 shows an example construction of the conductivity sensor 22 in a plating apparatus according to the present invention. In the drawing, the conductivity sensor 22 includes a bridge circuit 24. The bridge circuit 24 includes resistors 22-1 and 22-2 having predetermined resistances $R_A$ and $R_B$, respectively; a current circuit 22-3 that passes through each of the feeder contacts 15, including contact resistances in the feeder contacts 15; and a variable resistor 22-4 having a variable resistance $R_G$. All of the resistors 22-1 and 22-2, the current circuit 22-3, and variable resistor 22-4 are connected in the bridge circuit 24. A current sensor 22a is connected in the center of the bridge circuit 24. One bridge circuit 24 is provided for each of the feeder contacts 15.

In the conductivity sensor 22 described above, the resistance value $R_X$ of the current circuit 22-3 when the conductivity state of each of the feeder contacts 15 is normal is calculated by the following expression. Here, the resistance value $R_G$ in the variable resistor 22-4 is adjusted to achieve a detecting current of 0 in the current sensor 22a.

$$R_X = R_B / R_A \cdot R_G$$

Since changes in the $R_X$ of the current circuit 22-3 depend mainly on contact resistance in the feeder contacts 15, a poor contact state in one of the feeder contacts 15 will increase the contact resistance, throwing off the balance of the bridge circuit 24. When the bridge circuit 24 is unbalanced, a current will flow to the current sensor 22a. If the current exceeds a predetermined value indicating poor conductivity, a warning will be transmitted, or the plating power supply will be shut off.

By incorporating the conductivity sensor 22 in the plating apparatus of the present invention, it is possible to detect the state of contact between each of the feeder contacts 15 and the conductive area on the substrate 12 prior to or during the plating process. As a result, it is possible to prevent unevenness in the plating thickness caused by poor connections by the feeder contacts 15.

In FIGS. 6 and 7, bridge circuits of current sensors 22a are provided in the plating apparatus, one for each of the feeder contacts 15. However, it is also possible to provide only one bridge circuit 24 in a current sensor 22a for confirming the conductivity (contact state) of the feeder contacts 15 by switching a switch. Further, while a bridge circuit having a current sensor 22a is employed in the examples above, the feeder contacts 15 can be directly connected to the current sensor 22a to directly detect current flowing through each of the feeder contacts 15, providing the current sensor 22a has a high level of sensitivity.

One method for sensing the state of conductivity between the feeder contacts 15 and the conductive area on the substrate 12 is to detect the contact resistance by measuring resistance values between each of the feeder contacts 15. As shown in FIG. 8, the resistance values between one feeder contact 15 and another is a combined resistance R0 of contact resistances R1 and R3 between the feeder contacts 15 and the conductive area of the substrate 12 and resistance R2 of the conductive area itself. Since the resistances R1 and R3 are approximately several hundred mΩ, they must be measured with a high degree of accuracy.

FIG. 9 shows a fundamental circuit configuration for measuring the combined resistance R0 with high degree of accuracy. As shown in the drawing, the circuit includes an AC power source 31 (oscillating circuit), a constant current circuit 32, an amplifier 33, a synchronous detection circuit 34 (multiplying circuit), and a low pass filter 35. The AC power source 31 outputs an AC voltage $e_1 \sin \omega t$ to the X terminal of the synchronous detection circuit 34. The AC power source 31 also provides a current to the constant current circuit 32. The AC voltage generated from the AC power source 31 passes through the constant current circuit 32, which supplies a constant current to the combined resistance R0. The voltage generated from both ends of the combined resistance R0 is input into the amplifier 33. The amplifier 33 amplifies the signal and inputs the amplified AC voltage $e_2 \sin \omega t$ into the Y terminal of the synchronous detection circuit 34.

The voltage output from the synchronous detection circuit 34 is obtained by multiplying the AC voltage $e_1 \sin \omega t$ with the $e_2 \sin \omega t$ as follows.

$$(e1 \cdot e2 \cdot \sin \omega t^2)/10 = \{(e_1 \cdot e_2)/20\}(1 - \cos 2\omega t)$$

When this output voltage passes through the low pass filter 35, the low pass filter 35 removes the $\cos 2\omega t$ and outputs the direct current $(e_1 \cdot e_2)/20$. This DC output is proportional to the combined resistance R0.

Figure 10:
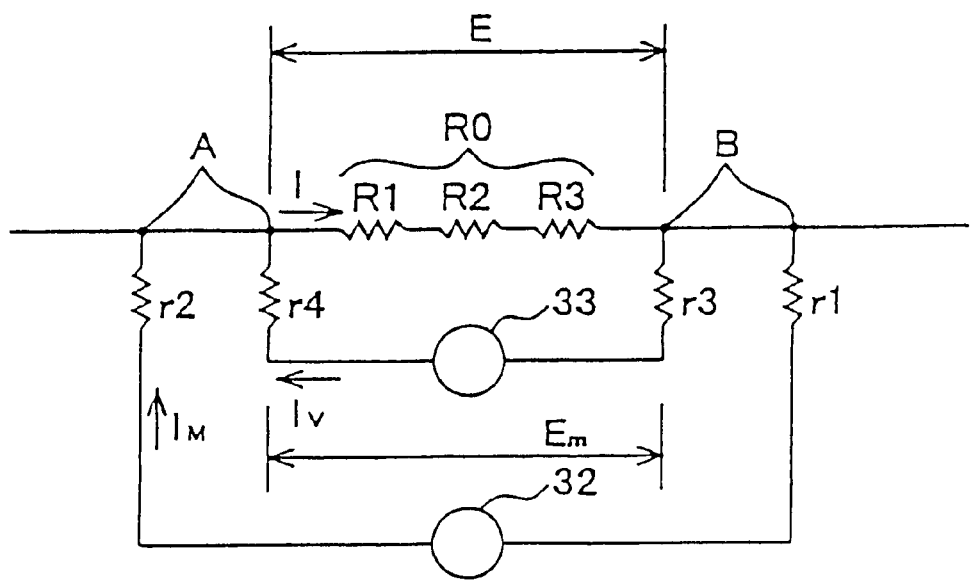
FIG. 10 shows an equivalent circuit for the feeder section of FIG. 3 showing resistance of wiring material and resistance between the feeder contacts.

Since the combined resistance R0 is normally 700–900 mΩ, the resistance of the wiring must be canceled in order to measure the combined resistance R0 accurately. FIG. 10 is an equivalent circuit for describing a method of canceling resistance in the wiring. As shown in the drawing, the equivalent circuit includes resistance values r1 and r2 of wiring connecting the constant current circuit 32 to the feeder contacts 15 (A and B), and resistance values r3 and r4 of wiring connecting the amplifier 33 to the feeder contacts 15 (A and B). Further, a current $I_M$ flows from the constant current circuit 32; a current $I_V$ flows to the amplifier 33; and a current I flows to the combined resistance R0.

Since the amplifier 33 is an operation amplifier having a high input impedance of 100 MΩ, $I_V \ll I_M$ and $I \approx I_M$. Accordingly, since $I_V \approx 0$, the input voltage $E_M$ of the amplifier 33 is as follows.

$$E_M = E - I_v(r3 + r4) \approx E$$

Here, E is the voltage on both ends of the combined resistance R0=R1+R2+R3. The resistance $R_M$ on the amplifier 33 side as viewed from the output side of the constant current circuit 32 is as follows.

$$R_M = E_M / I_M$$

$$R_M = E/I \approx R0$$

It is possible to cancel r1–r4 of the above wiring resistance by connecting the constant current circuit 32 and the amplifier 33 to both ends A and B of the combined resistance R0.

Figure 11:
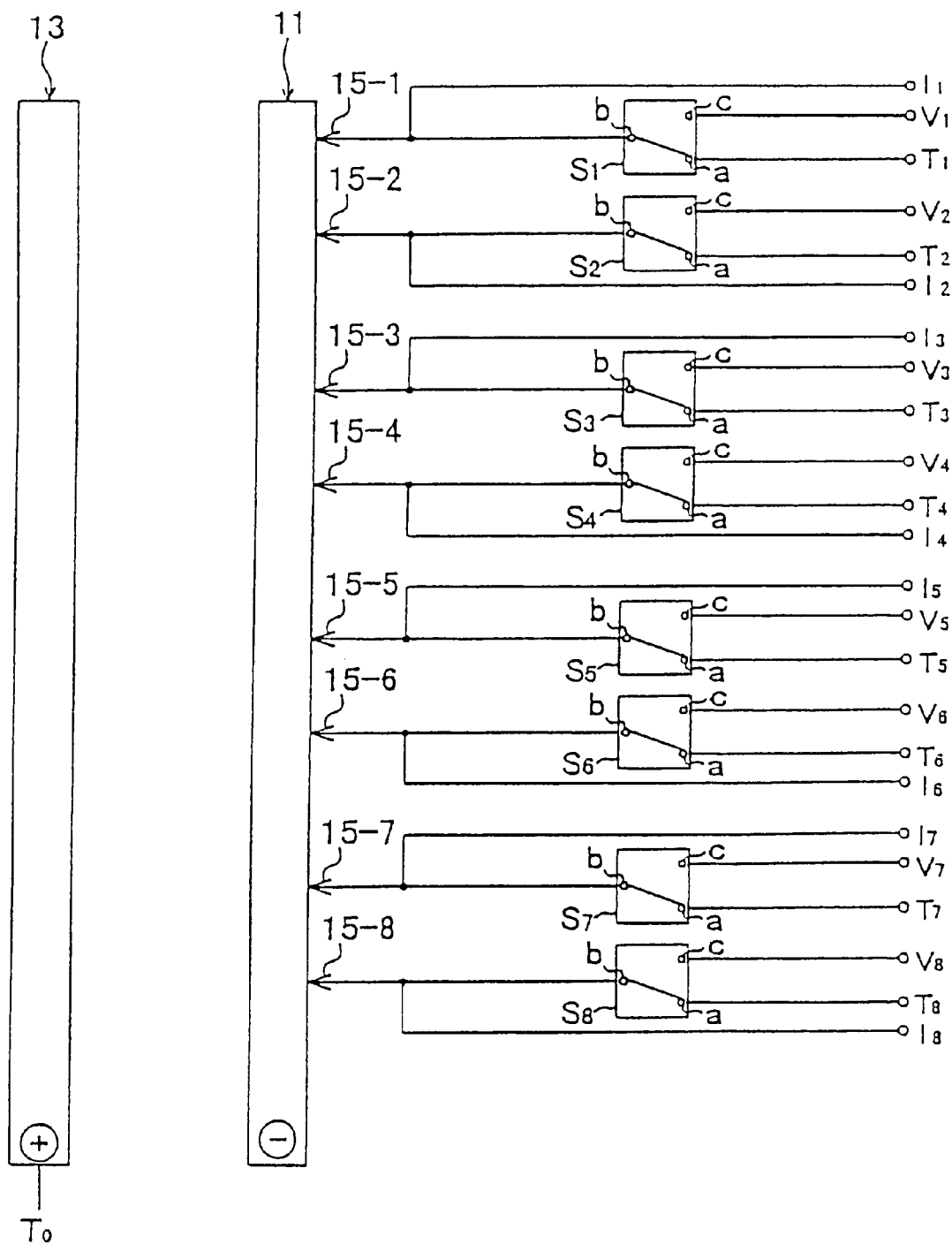
FIG. 11 shows the wiring configuration for measuring contact resistance at the feeder contacts and supplying current for plating.
Figure 12:
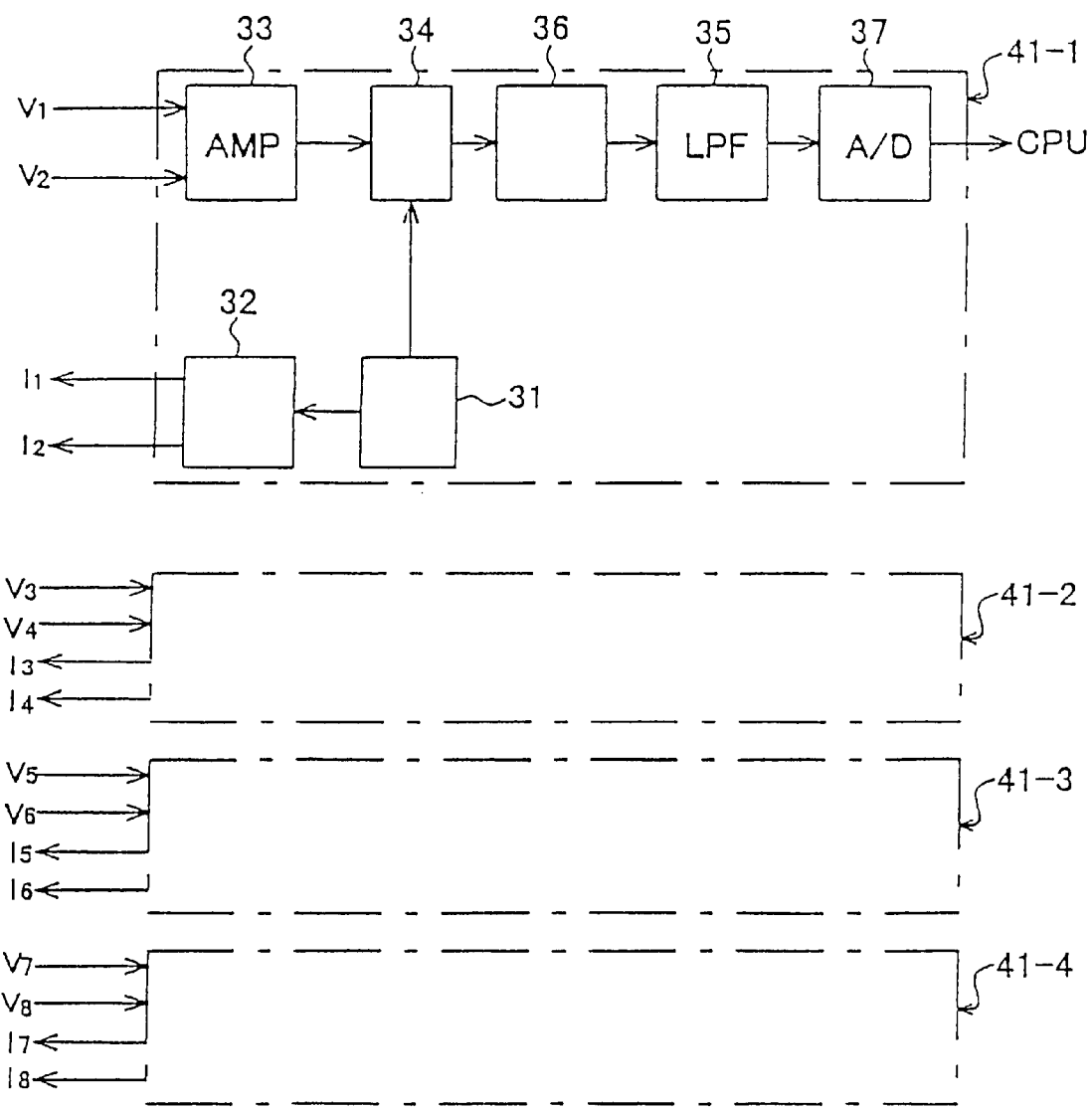
FIG. 12 shows an example circuit construction for a contact resistance measuring device disposed at the feeder contacts.
Figure 13:
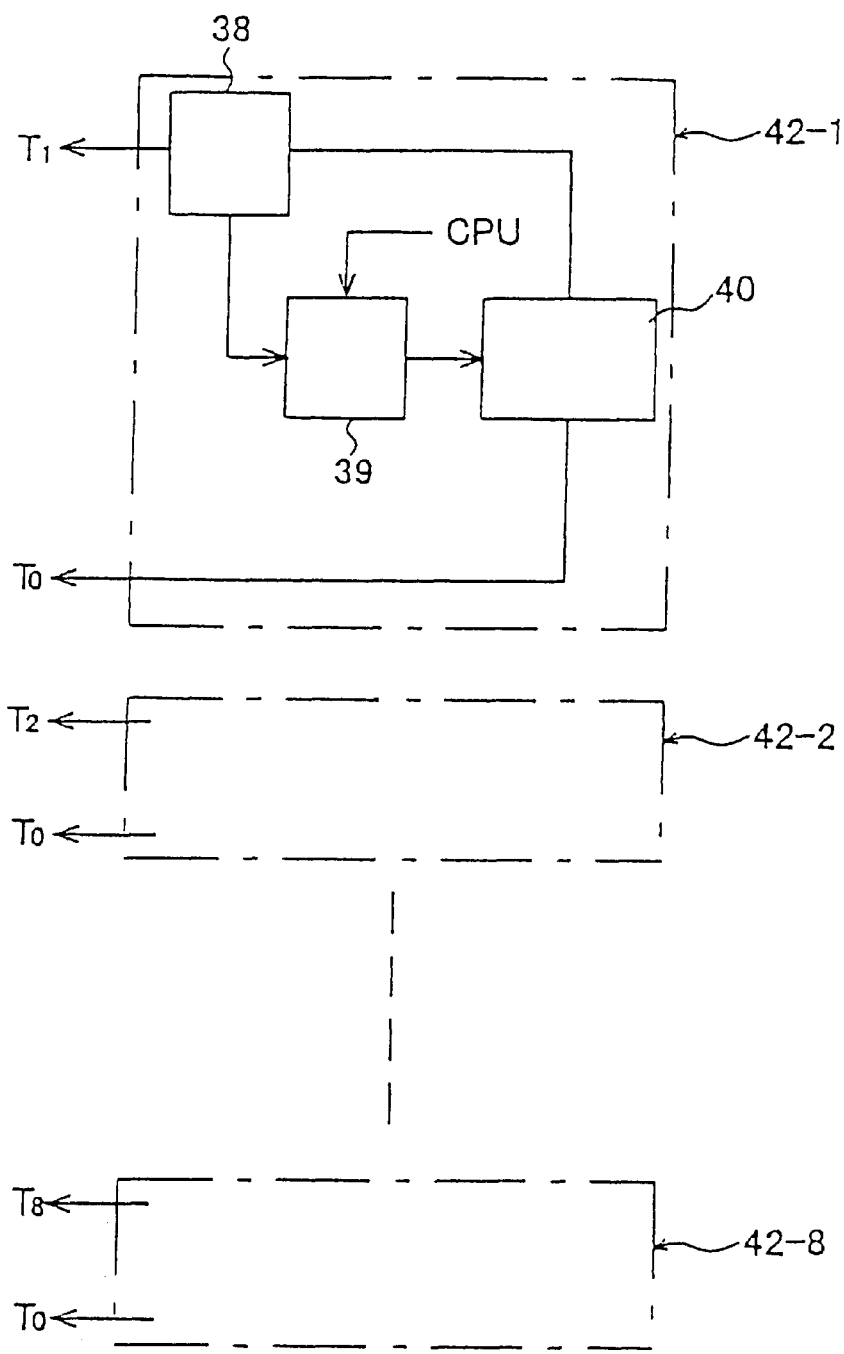
FIG. 13 shows an example circuit construction for a plating current supplying device of the plating apparatus.

Next, a plating apparatus using the methods described above for measuring resistance and canceling resistance in the wiring will be described with reference to FIGS. 11–13. FIG. 11 shows the circuit configuration for measuring contact resistance at the feeder contacts and for supplying a plating current. FIG. 12 shows a circuit configuration of the contact resistance measuring device. FIG. 13 shows the circuit configuration of the plating current supplying device. As shown in FIG. 11, a terminal $T_0$ is connected to the anode 13; terminals $I_1$–$I_8$ are directly connected to feeder contacts 15-1 through 15-8, respectively, on the jig 11; and terminals $V_1$–$V_8$ and $T_1$–$T_8$ are also connected to the feeder contacts 15-1 through 15-8 via switches $S_1$–$S_8$.

As shown in FIG. 12, the contact resistance measuring device includes four measuring circuits 41-1 through 41-4. Each of the measuring circuits 41-1 through 41-4 has the same circuit configuration and will therefore only be described for the measuring circuit 41-1. The measuring circuit 41-1 is provided with the AC power source 31, constant current circuit 32, amplifier 33, synchronous detection circuit 34, and low pass filter 35, as well as a DC amplifier 36 and an A/D converter 37. The measuring circuit 41-1 also includes terminals $V_1$, $V_2$, $I_1$, and $I_2$ connected to terminals $V_1$, $V_2$, $I_1$, and $I_2$ in FIG. 11. The measuring circuit 41-2 is provided with terminals $V_3$, $V_4$, $I_3$, and $I_4$ connected to terminals $V_3$, $V_4$, $I_3$, and $I_4$ in FIG. 11. The measuring circuit 41-3 is provided with terminals $V_5$, $V_6$, $I_5$, and $I_6$ connected to terminals $V_5$, $V_6$, $I_5$, and $I_6$ in FIG. 11. The measuring circuit 41-4 is provided with terminals $V_7$, $V_8$, $I_7$, and $I_8$ connected to terminals $V_7$, $V_8$, $I_7$, and $I_8$ in FIG. 11.

In the contact resistance measuring device described above, before the plating bath 10 (see FIG. 1) is filled with plating solution, the switches $S_1$–$S_8$ are switched to the contact c side. The constant current circuit 32 in each of the measuring circuits 41-1 through 41-4 supplies a constant current between each of the pair of feeder contacts 15-1 through 15-8 on the jig 11, where the jig 11 is mounting a substrate (not shown). The voltage generated between each of the feeder contacts 15 is measured via the amplifier 33, synchronous detection circuit 34, DC amplifier 36, and low pass filter 35. In this way, it is possible to cancel the resistances of the wiring to obtain a DC output proportional to the combined resistance R0.

The DC output from the low pass filter 35 is converted to a digital signal by the A/D converter 37 and transferred to the CPU. The CPU determines whether sufficient contact is made by the feeder contacts 15 based on this signal. If there is poor contact, the CPU reports which feeder contact 15 has insufficient contact. Poor contact can result from nonconformity of the mechanical portion of the feeder contacts and sometimes can be corrected by retrying the problematic feeder contact 15. If poor contact is detected, this retrying procedure is attempted.

If each of the feeder contacts 15 is attaining sufficient contact according to the contact resistance measuring device, that is, if all feeder contacts are conducting properly, the switches $S_1$–$S_8$ are switched to the contact a side. The plating bath 10 is filled with plating solution, and the plating current supplying device as shown in FIG. 13 supplies a plating current.

As shown in FIG. 13, the plating current supplying device includes eight plating current supply circuits 42-1 through 42-8.

Each of the plating current supply circuits 42-1 through 42-8 has the same structure and is provided with a terminal $T_0$ and one of the terminals $T_1$–$T_8$. The terminals $T_0$ and $T_1$–$T_8$ are connected to terminals $T_0$ and $T_1$–$T_8$ shown in FIG. 11.

Next, the structure of the plating current supply circuits 42-1 through 42-8 will be described using the plating current supply circuit 42-1. The plating current supply circuit 42-1 is provided with a plating current detecting circuit 38, a current control circuit 39, and a power source 40. The current control circuit 39 sets the circuit value based on a command from the CPU for plating conditions. A plating current of the value set by the current control circuit 39 is supplied from the power source 40 through the terminal $T_0$, anode 13, substrate 12 (see FIG. 1), each of the feeder contacts 15-1 through 15-8 on the jig 11, each of the switches $S_1$–$S_8$, and each of the terminals $T_1$–$T_8$.

The plating current detecting circuit 38 detects plating current flowing through each of the feeder contacts 15-1 through 15-8 and outputs a detection value to the current control circuit 39. The current control circuit 39 controls the power source 40 to provide a plating current with the value set above. Hence, if the current flowing through each of the feeder contacts 15-1 through 15-8 is set at a uniform value, it is possible to supply a uniform plating current through each of the feeder contacts 15 to form a uniform plating thickness on the substrate 12.

While example constructions of a contact resistance measuring device and plating current supplying device described have been described in detail, the concept of the present invention is not limited to those described above.

In the embodiments described above, a conductivity sensor is provided to detect the conductivity of a plurality of feeder contacts. Accordingly, it is possible to confirm the conductivity at each feeder contact, thereby eliminating one cause of non-uniformity in plating film thickness.

Further, a plating current detecting circuit is provided to detect the current flowing through each of the feeder contacts, and a current control circuit is provided to maintain the plating current at a uniform value based on the value of the current flowing through the feeder contacts detected by the plating current detecting circuit. Accordingly, it is possible to supply a uniform plating current through each of the feeder contacts to form a plating film on the plating surface of the substrate at a uniform thickness.

Industrial Applicability

The plating apparatus of the present invention can be used in the field of semiconductor fabrication and the like, as the invention enables the formation of a uniform plating film on a substrate, such as a semiconductor wafer and the like.

What is claimed is:

1. A plating apparatus for plating a substrate, comprising: a plating bath; an electrode disposed in the plating bath; a substrate mounted opposite the electrode and having a conductive area on its surface; a plating jig disposed in the plating bath for retaining the substrate and having a plurality of feeder contacts for contacting the conductive area on the surface of the substrate; a voltage supplying device for applying a voltage to supply a predetermined current between the plurality of feeder contacts and the electrode, thereby generating a current flowing for plating the substrate through the feeder contacts; wherein, the feeder contacts of the plating jig are electrically separated from each other; and for each feeder contact, one end of a reverse-current blocking diode is connected to wiring connecting the feeder contact, and the other end of the reverse-current blocking diode is connected to wiring connecting said voltage supplying device; and a conductivity state detecting device is provided for detecting the conductivity between each of the feeder contacts on the plating jig and the conductive area on the surface of the substrate.

2. A plating apparatus according to claim 1, wherein the conductivity state detecting device comprises a contact resistance measuring device for measuring contact resistance between the feeder contacts and the conductive area on the surface of the substrate, and is adapted to detect the conductivity state of the feeder contacts based on the contact resistance measured by the contact resistance measuring device.

3. A plating apparatus according to claim 2, wherein the contact resistance measuring device comprises an alternating current oscillating circuit, a constant current circuit, a synchronous detection circuit, and a low pass filter;

whereby the alternating current oscillating circuit supplies an alternating current between the feeder contacts via the constant current circuit, and the AC voltage generated between the feeder contacts is input into one of the input terminals on the synchronous detection circuit, while the AC voltage of the alternating current oscillating circuit is input into the other input terminal of the synchronous detection circuit, which multiplies the two AC voltages, outputting the result through the low pass filter to obtain a direct current output proportional to resistance value between the feeder contacts.

4. A plating apparatus according to claim 2, wherein the contact resistance measuring device further comprises a canceling device for canceling the resistance in wiring used to connect the contact resistance measuring device between the feeder contacts and which is adapted to eliminate the influence of resistance in wiring on the measurement results.

5. A plating apparatus according to claim 2, wherein a plating current detecting device is provided for detecting a plating current flowing through the feeder contacts, and a plating current controlling device is provided for maintaining a uniform plating current flowing through the feeder contacts based on output from the plating current detecting device.

* * * * *